United States Patent [19]

Pierrat

[11] Patent Number: 5,695,896
[45] Date of Patent: Dec. 9, 1997

[54] PROCESS FOR FABRICATING A PHASE SHIFTING MASK

[75] Inventor: Christophe Pierrat, Boise, Id.

[73] Assignee: Micron Technology, Inc., Boise, Id.

[21] Appl. No.: 566,857

[22] Filed: Dec. 4, 1995

[51] Int. Cl.$^6$ .................................................. G03F 9/00
[52] U.S. Cl. ........................ 430/5; 430/314; 430/322; 430/323
[58] Field of Search ............................... 430/5, 322, 323, 430/324, 314

[56] References Cited

U.S. PATENT DOCUMENTS

| | | | |
|---|---|---|---|
| 5,308,722 | 5/1994 | Nistler | 430/5 |
| 5,397,664 | 3/1995 | Noelscher et al. | 430/5 |
| 5,457,006 | 10/1995 | Hirokane et al. | 430/5 |

FOREIGN PATENT DOCUMENTS 2-140743  5/1990  Japan .

Primary Examiner—S. Rosasco
Attorney, Agent, or Firm—Arnold, White & Durkee

[57] ABSTRACT

A simplified process for forming a phase shifting mask is disclosed. A chrome layer is formed on a transparent substrate and patterned. A resist layer is patterned to define the phase shifting areas and the substrate is dry etched to a first predetermined depth, stripped and cleaned. Another resist layer is patterned to define the phase shifting areas and the substrate is dry etched a second predetermined depth, stripped and cleaned. A further resist layer is patterned to define the phase shifting areas and the substrate is wet etched a third predetermined depth, stripped and cleaned. The sum of the three predetermined depths is such that it corresponds to a 180° phase shift of light passing through the substrate. The third predetermined depth is at least about one third of the total depth.

15 Claims, 2 Drawing Sheets

5,695,896

1

PROCESS FOR FABRICATING A PHASE SHIFTING MASK

This invention was made with government support under Contract No. MDA-972-92-C0054 awarded by Advanced Research Projects Agency (ARPA). The government has certain rights in this invention.

BACKGROUND

The present invention relates to processes for creating photomasks or reticles used in the fabrication of semiconductor devices. More particularly, the present invention relates to processes for forming phase shifting masks.

Advances in capacity in semiconductor chips have generally been the result of decreases in the size of the features on the chip. The lateral dimensions of features are generally defined by photolithographic techniques in which a detailed pattern is transferred to a photoresist by shining light through a mask or reticle.

In recent years, phase shifting masks have been developed to improve photolithographic processes. Phase shifting masks increase image contrast and resolution without reducing wave length or increasing numerical aperture. These masks also improve depth of focus and process latitude for a given feature size.

With phase shift photolithography, the interference of light rays is used to overcome the problems of diffraction and improve the resolution and depth of optical images projected onto a target. With this technology, the phase of the exposure light at the target is controlled such that adjacent bright areas are preferably formed 180 degrees out of phase with each other. Dark regions are thus produced between the bright areas by destructive interference even when diffraction would otherwise cause these areas to be lit. This technique improves total resolution at the target.

In general, a phase shifting mask is constructed with a repetitive pattern formed of three distinct layers of material. An opaque layer provides areas that allow no light transmission. A first transparent layer provides areas which allow close to 100% of the light to pass through. A transparent phase shifting layer provides areas which allow close to 100% of the light to pass through but phase shifted 180 degrees from the light passing through the first transparent layer. The first transparent layer and the phase shifting layer are positioned such that light rays diffracted through each area are cancelled out in a darkened area between them. This creates a pattern of dark and bright areas which can be used to clearly delineate features of a pattern defined by the opaque layer on the semiconductor wafer.

One process for fabricating phase shifting masks is disclosed in U.S. Pat. No. 5,308,722 which uses a voting technique to fabricate a defect-free printing mask. The disclosed process includes forming an opaque layer on a major surface of a transparent substrate, patterning the opaque layer to expose portions of the underlying transparent substrate, forming a phase shifting mask layer to expose the portions of the underlying transparent substrate, phase-etching part way into the exposed portions of the transparent substrate by an amount equivalent to a preselected phase shift angle, and voting the phase shifting mask layer to accomplish the phase-etching in a series of steps, each equal to the phase shift angle, until a full 180° phase shift is accomplished. The number of phase-etching steps claimed in the patent is from three to five.

Other processes of fabricating phase shifting masks are disclosed in Japanese Patent Application No. 63-295350.

2

This application discloses processes in which a transparent film is formed over a potion of a mask to create a phase shift as well as the etching of phase shifting channels into the mask substrate.

One of the problems associated with the fabrication of phase shifting masks is the formation of defects in the mask which are then transferred to the semiconductor device. Defects in phase shifting masks are more critical than similar sized defects in standard chrome masks. The benefit of greater contrast that is achieved with phase shifting masks also causes defects to be more noticeable. Additionally, detecting and correcting defects in phase shifting masks is much harder.

Accordingly, it would be a significant advancement in the art to provide a process for fabricating phase shifting masks which requires fewer steps than current processing techniques while also decreasing the probability of forming serious defects. Such a process is disclosed and claimed herein.

SUMMARY OF THE INVENTION

The present invention provides a novel process for fabricating defect free phase shifting masks. In the preferred embodiment, the mask is etched in three steps: two dry etches followed by a wet etch. Any defects created during the dry etches are reduced by the wet etch.

In the preferred embodiment, a chrome layer is formed on a quartz substrate and is patterned using e-beam or UV photolithography techniques. A resist layer is then coated on the mask and exposed using e-beam or UV to define the phase shifting areas. The resist is then developed and the quartz is etched using a dry etching technique to a first predetermined depth.

The resist layer is then stripped and the mask is cleaned. A new layer of resist is then coated on the mask and again exposed and developed. A second dry etch is then performed to etch the quartz a second predetermined depth. The resist layer is again stripped and the mask is cleaned.

Finally, another resist layer is coated on the mask, exposed and developed. The quartz is then etched using a wet etch process to a third predetermined depth.

The sum of the three predetermined depths is such that it corresponds to a 180° phase shift of the light passing through the etched quartz areas with respect to the unetched quartz areas. For example, when using an exposure light with a wavelength of 365 nm, the sum of the three predetermined depths should be equal to 385 nm. In this embodiment, the third predetermined depth should be approximately 150 nm. Additionally, the first and second predetermined depths should be essentially equal.

In the preferred embodiment, the wet etch is performed using BOE 7:1 (using buffered HF in water). The etch is preferably performed at room temperature.

DETAILED DESCRIPTION OF THE PREFERRED EMBODIMENTS

The present invention provides a novel process for fabricating phase shifting masks. The invention is best understood by reference to the attached drawings in which like pans are designated with like numerals.

Figure 1A:
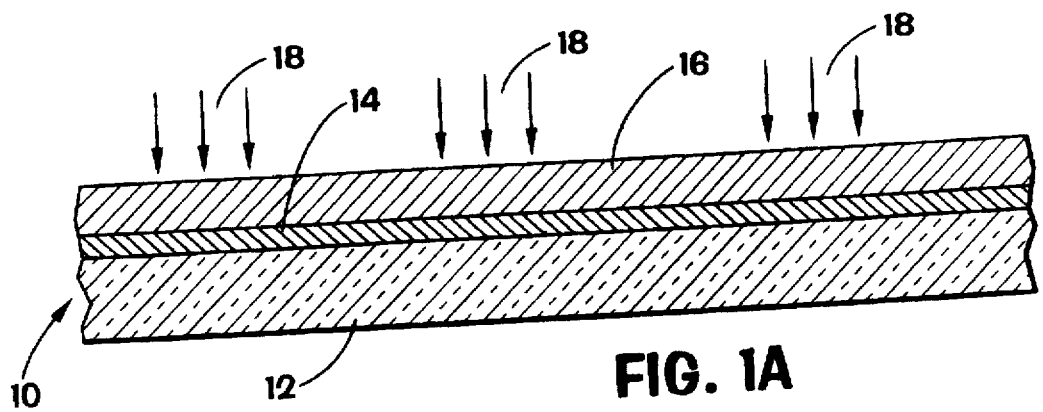
FIGS. 1A to 1F are cross sectional views of a portion of a mask illustrating the process steps of the present invention.

Referring first to FIG. 1A, a portion of a mask 10 is show in cross section. Mask 10 includes a quartz substrate 12 on which a layer of chrome 14 has been deposited. A photoresist 16 is deposited over chrome 14 and exposed to radiation 18. In the preferred embodiment radiation 18 is either e-beam or UV radiation.

Figure 1B:
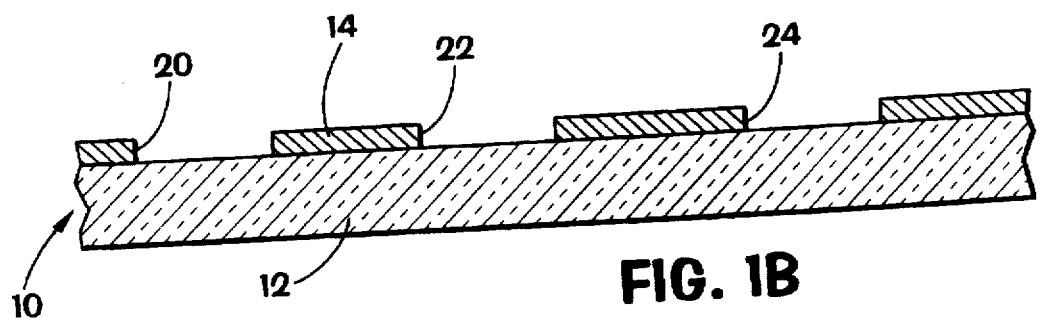

Resist 16 is then developed and the exposed portions of chrome layer 14 are etched away. The remaining portions of the photoresist are then removed and the mask is cleaned. As illustrated in FIG. 1B, chrome layer 14 now includes a plurality of openings 20, 22 and 24.

Figure 1C:
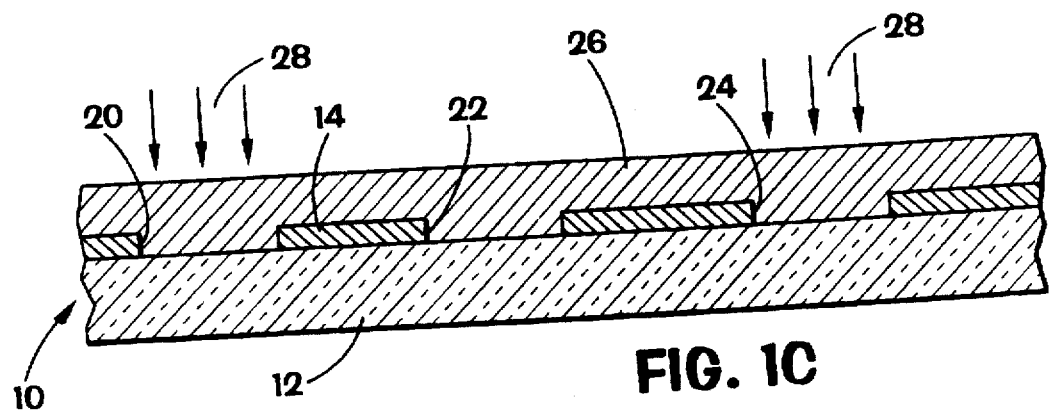

Referring next to FIG. 1C, another layer of photoresist 26 is applied over the top of the mask 10 and exposed to radiation 28 in the areas above openings 20 and 24. Opening 22 is not exposed so that alternating openings will be phase shifted. The resist is then developed and quartz substrate 12 is etched using a dry etch process. Any standard dry etching process can be used.

Figure 1D:
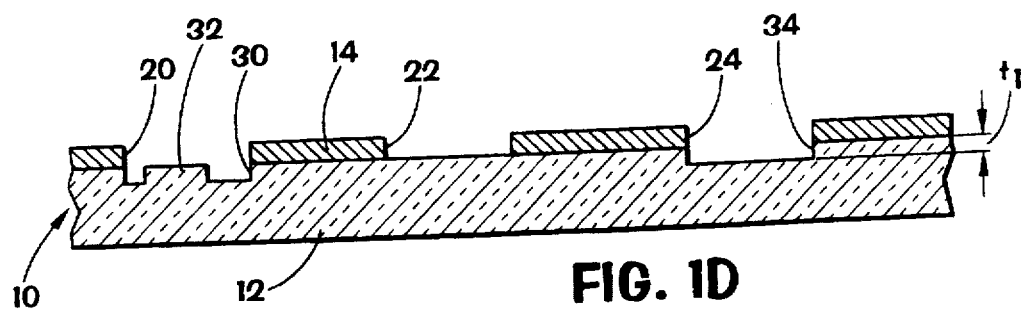

Referring to FIG. 1D, quartz substrate 12 has been etched in areas 30 and 34 to a depth of $t_1$. A defect 32 was created in area 30 during the etching step. However, as explained more fully below, the process of the present invention reduces the deleterious effects of defect 32.

Figure 1E:
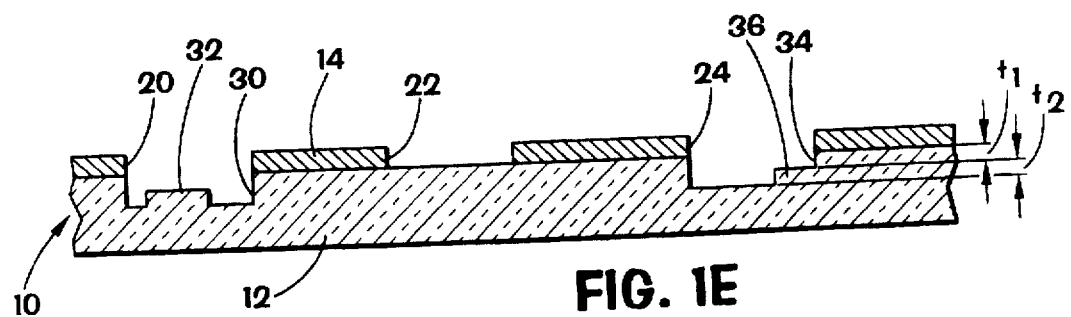
Figure 1F:
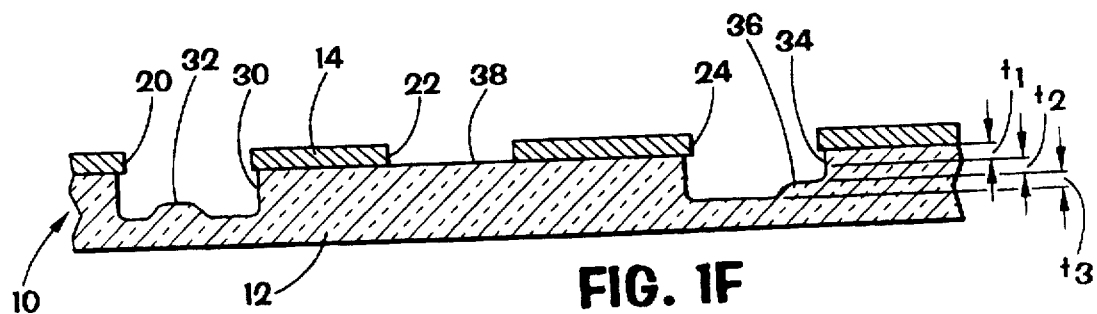

After the first dry etch step, mask 10 is thoroughly cleaned and coated with another layer of photoresist which is developed and processed. Quartz substrate 12 is then etched a second time using a dry etch process. As shown in FIG. 1E, etched areas 30 and 34 have been deepened by an additional depth $t_2$. Defect 32 is still present in etched area 30 but it still only has a height of $t_1$. A new defect 36 was created in etched area 34 during the second etch step. Defect 36 has a height of $t_2$.

Mask 10 is again cleaned and another layer of photoresist is coated over the top of the mask, exposed and developed. Quartz substrate 12 is then etched using a wet etch which increases the depth of etched areas 30 and 34 by an additional depth $T_3$. This wet etch reduces the diffraction effects at the bottom of etched areas 30 and 34. Additionally, it makes the edges of defects 32 and 36 smoother and the defects smaller, thus reducing defect printability.

An advantage of the present invention is that the wet etch step is only performed in quartz areas 30 and 34 which have already been dry etched which reduces the risk of creating defects in the unetched quartz areas such as area 38.

The etched depths $t_1$, $t_2$, and $t_3$ are such that the total depth corresponds to a 180° phase shift of the light passing through the etched quartz areas 30 and 34 with respect to unetched quartz area 38. For example, using light with a wave length of 365 nm, the sum of $t_1$, $t_2$, and $t_3$ should be equal to 385 nm for a quartz mask. To lower the diffraction effects along the edges of the etched quartz areas for an i-line mask, $t_3$ should be between about 50 and 150 nm. More preferably, $t_3$ is between about 90 and 150 nm. In the preferred embodiment, $t_3$ is approximately 150 nm. Ideally, $t_1$ and $t_2$ are equal so that the phase of any defects such as defects 32 and 34 is minimized and their printability reduced. In the preferred embodiment, the depth $t_3$ of the wet etch is at least one third of the total depth of the phase shifted area.

The dry etch steps of the invention are performed using any suitable dry etching technique. These processes are well known to those skilled in the art. In the preferred embodiment, the wet etched is performed using a BOE 7:1 (buffered HF in water) etch which is performed at room temperature. This results in an etch rate of about 13.5 angstroms per second. Another suitable wet etch comprises a 10% by weight aqueous solution of NaOH. At 70° C. this etch etches about 100 nm of quartz in 50 minutes.

While the invention has been described with respect to the presently preferred embodiments, it will be appreciated by those skilled in the art that modifications and changes can be made to the process of the present invention without departing from its spirit or essential characteristics. For example, different types of wet etches can be used. Additionally, substrates other than quartz can be used. Also, the invention has been described with respect to an i-line mask. It can also be used for g-line and deep UV masks. Accordingly, all modifications or changes which come within the meaning and range of equivalency of the claims are to be embraced within their scope.

What is claimed is:

1. A process for fabricating a phase shifting mask comprising:

patterning an opaque layer on a transparent mask substrate to form a desired pattern;

coating said substrate with a resist and creating a first phase shifting pattern on said substrate;

dry etching said substrate through said first pattern to a first predetermined depth;

removing said resist forming said first phase shifting pattern and cleaning said substrate;

coating said substrate with a resist and creating a second phase shifting pattern on said substrate;

dry etching said substrate through said second pattern to a second predetermined depth;

removing said resist forming said second phase shifting pattern and cleaning said substrate;

coating said substrate with a resist and creating a third phase shifting pattern on said substrate;

wet etching said substrate through said third pattern to a third predetermined depth; and removing said resist forming said third phase shifting pattern and cleaning said substrate;

wherein the sum of said first, second and third predetermined depths creates a pattern in said substrate corresponding to a 180° phase shift of light passing through said substrate.

2. A process for fabricating a phase shifting mask as defined in claim 1 wherein said wet etching step comprises etching said substrate with a BOE 7:1, using a buffered HF in water solution.

3. A process for fabricating a phase shifting mask as defined in claim 1 wherein said first and second predetermined depths are substantially equal and said third predetermined depth is greater than or equal to said first predetermined depth.

4. A process for fabricating a phase shifting mask as defined in claim 1 wherein said mask substrate comprises quartz.

5. A process for fabricating a phase shifting mask as defined in claim 1 wherein said third predetermined depth is between about 50 and 150 nm.

6. A process for fabricating a phase shifting mask as defined in claim 5 wherein said third predetermined depth is between about 90 and 150 nm.

7. A process for fabricating a phase shifting mask as defined in claim 6 wherein said third predetermined depth is about 150 nm.

8. A phase shifting mask produced by the process of claim 1.

9. A process for fabricating a phase shifting mask comprising:

patterning an opaque layer on a transparent mask substrate to form a desired pattern;

coating said substrate with a resist and creating a first phase shifting pattern on said substrate;

dry etching said substrate through said first pattern to a first predetermined depth;

removing said resist forming said first phase shifting pattern and cleaning said substrate;

coating said substrate with a resist and creating a second phase shifting pattern on said substrate;

dry etching said substrate through said second pattern to a second predetermined depth;

removing said resist forming said second phase shifting pattern and cleaning said substrate;

coating said substrate with a resist and creating a third phase shifting pattern on said substrate;

wet etching said substrate through said third pattern to a third predetermined depth; and removing said resist forming said third phase shifting pattern and cleaning said substrate;

wherein the sum of said first, second and third predetermined depths creates a pattern in said substrate corresponding to a 180° phase shift of light passing through said substrate and said third predetermined depth is at least about one third of the total depth.

10. A process for fabricating a phase shifting mask as defined in claim 9 wherein said wet etching step comprises etching said substrate with a BOE 7:1, using a buffered HF in water solution.

11. A process for fabricating a phase shifting mask as defined in claim 9 wherein said mask substrate comprises quartz.

12. A process for fabricating a phase shifting mask as defined in claim 9 wherein said third predetermined depth is between about 50 and 150 nm.

13. A process for fabricating a phase shifting mask as defined in claim 12 wherein said third predetermined depth is between about 90 and 150 nm.

14. A process for fabricating a phase shifting mask as defined in claim 13 wherein said third predetermined depth is about 150 nm.

15. A phase shifting mask produced by the process of claim 9.

* * * * *

UNITED STATES PATENT AND TRADEMARK OFFICE
CERTIFICATE OF CORRECTION

PATENT NO.    :   5,695,896

DATED         :   December 9, 1997

INVENTOR(S)   :   Pierrat

It is certified that error appears in the above-identified patent and that said Letters Patent is hereby corrected as shown below:

Column 2, line 2, potion should be portion.

Column 2, line 65, pans should be parts.

Signed and Sealed this

Third Day of March, 1998

*Attest:*

BRUCE LEHMAN

*Attesting Officer*        Commissioner of Patents and Trademarks